(12) United States Patent
Kelly

(10) Patent No.: US 11,145,544 B2
(45) Date of Patent: Oct. 12, 2021

(54) CONTACT ETCHBACK IN ROOM TEMPERATURE IONIC LIQUID

(71) Applicant: Taiwan Semiconductor Manufacturing Co., Ltd., Hsinchu (TW)

(72) Inventor: Andrew Joseph Kelly, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 161 days.

(21) Appl. No.: 16/407,951

(22) Filed: May 9, 2019

(65) Prior Publication Data

US 2020/0135559 A1 Apr. 30, 2020

Related U.S. Application Data

(60) Provisional application No. 62/752,554, filed on Oct. 30, 2018.

(51) Int. Cl.
*H01L 21/76* (2006.01)
*H01L 21/768* (2006.01)
(Continued)

(52) U.S. Cl.
CPC .. *H01L 21/76883* (2013.01); *H01L 21/28556* (2013.01); *H01L 21/7684* (2013.01); *H01L 21/76802* (2013.01); *C23F 1/10* (2013.01)

(58) Field of Classification Search
CPC ......... H01L 21/76883; H01L 21/28556; H01L 21/76802; H01L 21/7684; H01L 21/32134;
(Continued)

(56) References Cited

U.S. PATENT DOCUMENTS 6,378,759 B1 * 4/2002 Ho ................. B23K 20/007
228/180.21
8,772,109 B2 7/2014 Colinge
(Continued)

OTHER PUBLICATIONS

Raz, Ofer at al., "Ruthenium electrodeposition on silicon from a room-temperature ionic liquid", Electrochimica Acta, vol. 54, Issue 25, Oct. 30, 2009, pp. 6042-6045.
(Continued)

*Primary Examiner* — Charles D Garber
*Assistant Examiner* — S M Sohel Imtiaz
(74) *Attorney, Agent, or Firm* — Haynes and Boone, LLP

(57) ABSTRACT

The present disclosure provides an integrated circuit with an interconnect structure and a method for forming the integrated circuit. In one embodiment, a method of the present disclosure includes receiving a workpiece that includes a first recess in a dielectric layer over the workpiece, depositing a contact fill in the first recess and over the dielectric layer to form a contact feature, planarizing a top surface of the workpiece to remove the contact fill over the dielectric layer, depositing an interlayer dielectric layer over the planarized top surface of the workpiece, forming a second recess in the interlayer dielectric layer to expose the contact fill in the dielectric layer, recessing the contact fill by soaking the workpiece in a room temperature ionic liquid, and depositing a conductive layer over the recessed contact fill. The material forming the contact fill is soluble in the room temperature ionic liquid.

20 Claims, 16 Drawing Sheets

(51) Int. Cl.
  *H01L 21/285* (2006.01)
  *C23F 1/10* (2006.01)
(58) Field of Classification Search
  CPC ......... H01L 21/76804; H01L 21/76805; H01L 21/76814; H01L 21/76855; H01L 21/28518; H01L 21/76831; H01L 21/76843; H01L 21/76856; H01L 21/76897; H01L 21/76838; H01L 21/76877; H01L 21/823431; H01L 21/823475; C23F 1/10; C23F 11/12
  See application file for complete search history.

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2001/0018248 A1* | 8/2001 | An | H01L 21/76883 438/253 |
| 2002/0001955 A1* | 1/2002 | Wang | H01L 21/02074 438/693 |
| 2003/0225303 A1* | 12/2003 | Magna | C07C 47/02 568/456 |
| 2007/0126120 A1* | 6/2007 | Tsao | H01L 23/53238 257/758 |
| 2008/0116170 A1* | 5/2008 | Collins | C23F 1/30 216/87 |
| 2010/0009531 A1* | 1/2010 | Choi | H01L 21/76883 438/643 |
| 2010/0010270 A1* | 1/2010 | Olivier-Bourbigou | C07C 45/50 568/451 |
| 2010/0323584 A1* | 12/2010 | Haga | H01L 21/3212 451/36 |
| 2014/0145345 A1* | 5/2014 | Brunner | H01L 23/481 257/774 |
| 2016/0177457 A1* | 6/2016 | Yokomizo | C23F 1/38 438/754 |
| 2016/0190062 A1* | 6/2016 | Zheng | H01L 23/5226 257/774 |
| 2016/0379870 A1* | 12/2016 | Clark | H01L 21/31144 438/694 |
| 2017/0338148 A1* | 11/2017 | Shusterman | H01L 21/76847 |
| 2018/0323151 A1* | 11/2018 | Briggs | H01L 21/76834 |
| 2019/0362979 A1* | 11/2019 | Liang | H01L 21/28562 |
| 2019/0393409 A1* | 12/2019 | Maniscalco | H01L 23/528 |

OTHER PUBLICATIONS

Arthur Unknown, "Ionic Liquids", ChemFiles, vol. 5, No. 6, sigma-aldrich.com, 24 pages.

* cited by examiner

CONTACT ETCHBACK IN ROOM TEMPERATURE IONIC LIQUID

PRIORITY DATA

The present application claims the benefit of U.S. Provisional Application No. 62/752,554, entitled "Method for Ruthenium Etch Without Ruthenium Oxide Formation in a Toom-Temperature Ionic Liquid," filed Oct. 30, 2018, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), Multiple-gate FETs (MuFETs), Gate-all-around FETs (GAAFETs), planar FETs, memory devices, Bipolar-Junction Transistors (BJTs), Light-Emitting Diodes (LEDs), other active and/or passive devices, etc.). The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
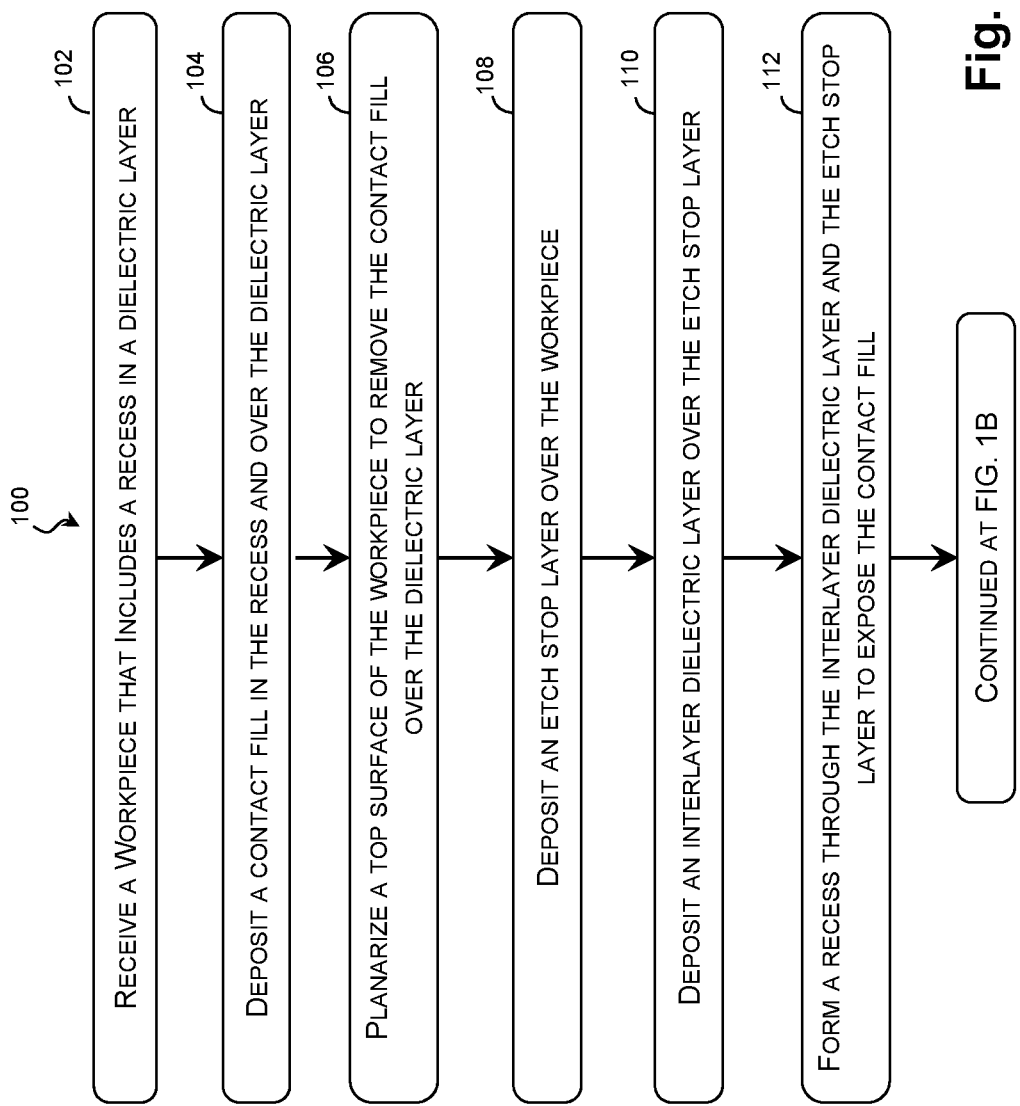
FIGS. 1A and 1B are a flow diagram of a method of fabricating a workpiece with an interconnect structure according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer with a complex interconnect structure disposed on top to electrically couple the devices. While there have been significant advances in fabrication and in miniaturizing the devices, many challenges remain. For example, in order to lower contact resistance between a contact feature, which may be formed of cobalt, tungsten and ruthenium, and an overlying conductive structure, the contact feature may be recessed by wet etching. When an oxidizer solution is used to oxidize the metal contact feature, metal oxide, such as cobalt oxide ($CoO$ or $COO_x$), tungsten oxide ($WO_3$ or $WO_x$) and ruthenium oxide ($RuO_2$, $RuO_4$, or $RuO_x$), may be formed. These oxide not only may increase contact resistance but also may become a particle source capable of contaminating the reaction chamber and reducing process yield. In addition, some metal oxide may be volatile and have a high vapor pressure. For example, ruthenium (VIII) oxide ($RuO_4$) is volatile. Not only that, because ruthenium (VIII) oxide ($RuO_4$) is toxic, additional equipment may be required to trap or safely dispose of ruthenium (VIII) oxide ($RuO_4$). The gaseous ruthenium (VIII) oxide ($RuO_4$) may also redeposit as ruthenium (IV) oxide ($RuO_2$) on the surface of the contact feature, thereby undesirably increasing the contact resistance. Alternative techniques, such as dry etching, alkaline wet etching and non-aqueous oxidizer solution, have been proposed. However, these alternative techniques also face various challenges. For instance, etching the contact feature using dry etching or alkaline wet etching nevertheless generate metal oxide, including volatile oxide such as ruthenium (VIII) oxide ($RuO_4$). A non-aqueous oxidizer solution tends to include volatile organic solvents, which may give rise to explosion hazards because violent oxidization reactions between the organic solvent vapor and the oxidizer solute may take place.

Some examples of the present technique address these issues and others by recessing the contact feature using a room temperature ionic liquid. Metals forming the contact feature are soluble in the room temperature ionic liquid. Because the room temperature ionic liquid is not a source oxygen, no metal oxide is produced out of the interaction between the contact feature and the room temperature ionic liquid. Several optional techniques can be used in conjunction with use of the room temperature ionic liquid. For example, a ligand may be added in the room temperature ionic liquid to enhance chelation of ions of the metals forming the contact feature. A voltage (electrical potential) may be applied to anodically oxidize a top surface of the contact feature. In addition, a digital etch process that alternates between an oxidization step and a room temperature ionic liquid soaking step may be used. The use of the room temperature ionic liquid reduces the amount of metal oxide, lowers the contact resistance, eliminates the need for additional toxic gas treatment equipment, and facilitates recycle of ruthenium. Further, it is noted that these advantages are merely examples, and no particular advantage is required for any particular embodiment.

Figure 1B:
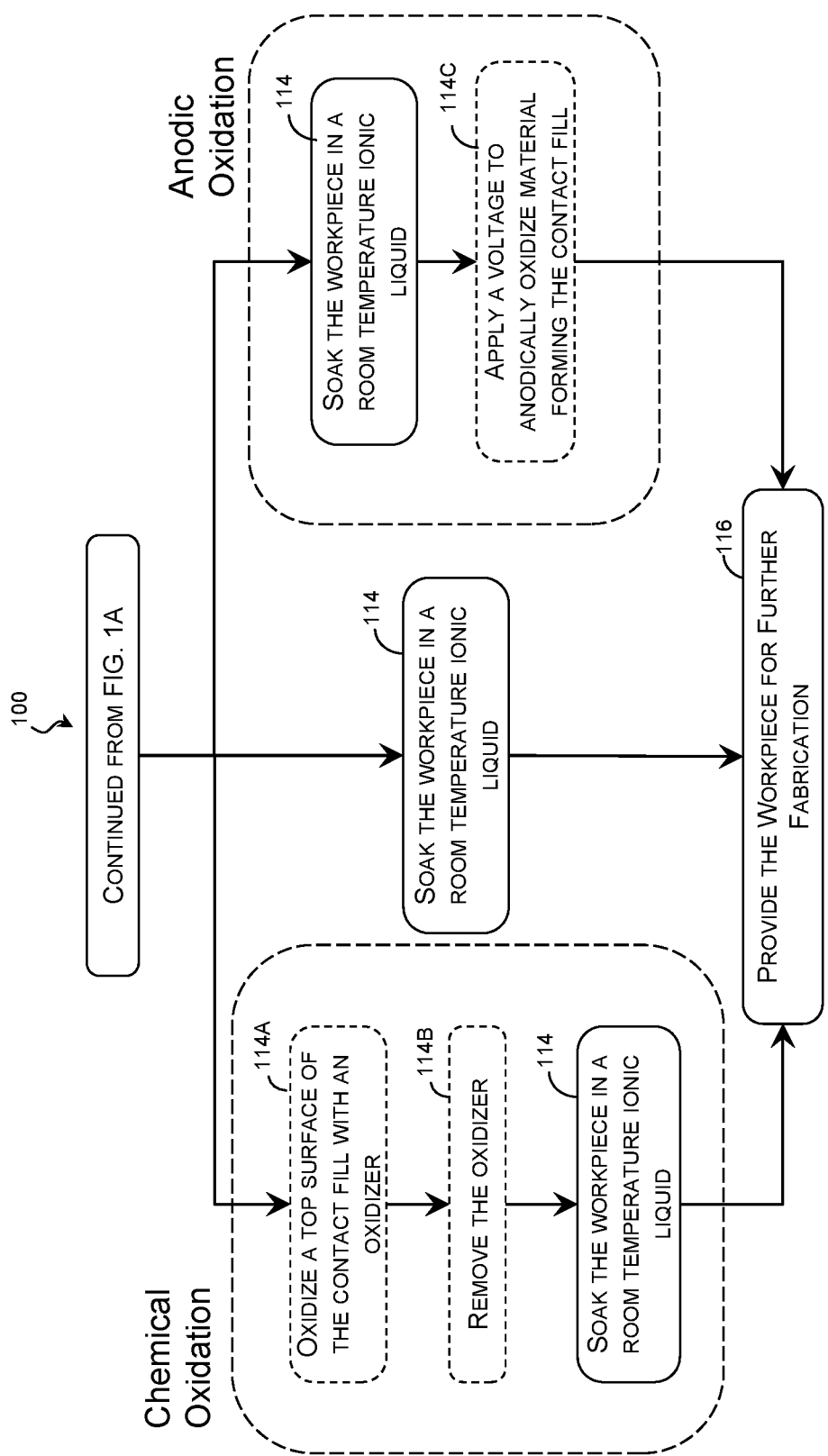
Figure 2:
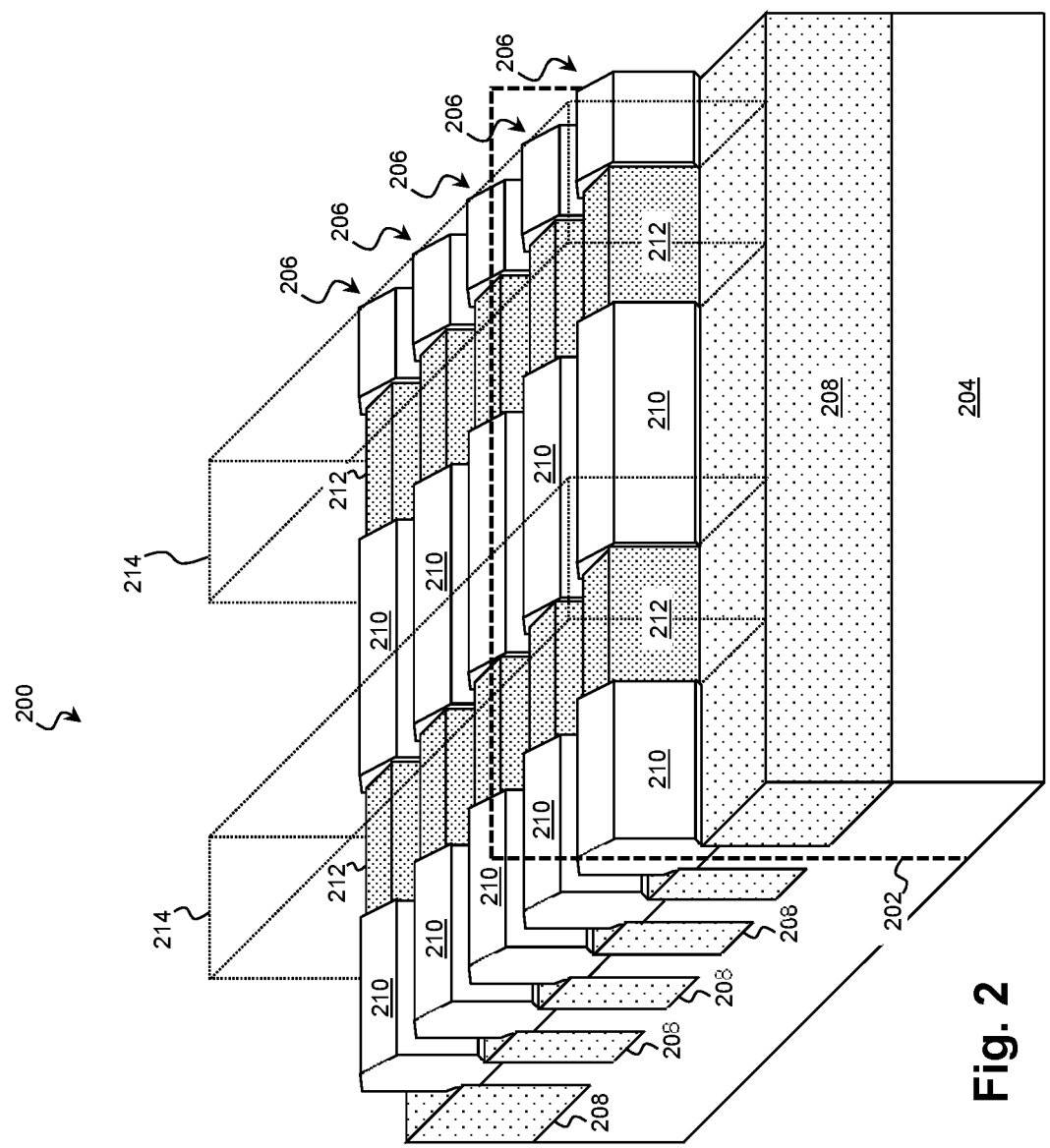
FIG. 2 is a perspective illustration of the workpiece undergoing a method of fabrication according to various aspects of the present disclosure.

The present disclosure provides examples of an integrated circuit that includes a contact feature. Examples of the circuit and a technique for forming the circuit are described with reference to FIGS. 1-15. In that regard, FIGS. 1A and 1B show a flow diagram of a method 100 of fabricating a workpiece 200 with an interconnect structure according to various aspects of the present disclosure. Additional steps can be provided before, during, and after the method 100, and some of the steps described can be replaced or eliminated for other embodiments of the method 100. FIG. 2 is a perspective illustration of the workpiece 200 undergoing the method 100 of fabrication according to various aspects of the present disclosure. FIGS. 3-15 are fragmentary cross-sectional illustrations of the workpiece 200 taken in a fin-length direction that cut through a fin, as indicated by plane 202, according to various aspects of the present disclosure.

Referring to block 102 of FIG. 1A and FIG. 2, a workpiece 200 is received that includes one or more circuit devices such as planar Field Effect Transistors (FETs), Fin-like FETs (FinFETs), Multiple-gate FETs (MuFETs), Gate-all-around FETs (GAAFETs), memory devices, bipolar-junction transistors, light-emitting diodes LEDs, other active and/or passive devices, etc. In the example of FIG. 2, the workpiece 200 includes FinFETs, although the technique is equally suitable for planar FETs, vertical FETs, and/or any other suitable type and configuration of circuit device.

The workpiece 200 includes a substrate 204 upon which the circuit device(s) are formed. In various examples, the substrate 204 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 204 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 204. In some such examples, a layer of the substrate 204 may include an insulator such as a semiconductor oxide, a semiconductor nitride, a semiconductor oxynitride, a semiconductor carbide, and/or other suitable insulator materials.

Doped regions, such as wells, may be formed on the substrate 204. In that regard, some portions of the substrate 204 may be doped with p-type dopants, such as boron, $BF_2$, or indium while other portions of the substrate 204 may be doped with n-type dopants, such as phosphorus or arsenic; and/or other suitable dopants including combinations thereof.

In some examples, the devices on the substrate 204 extend out of the substrate 204. For example, FinFETs and/or other non-planar devices may be formed on device fins 206 disposed on the substrate 204. The device fins 206 are representative of any raised feature and include FinFET device fins 206 as well as fins 206 for forming other raised active and passive devices upon the substrate 204. The fins 206 may be similar in composition to the substrate 204 or may be different therefrom. For example, in some embodiments, the substrate 204 may include primarily silicon, while the fins 206 include one or more layers that are primarily germanium or a SiGe semiconductor. In some embodiments, the substrate 204 includes a SiGe semiconductor, and the fins 206 include a SiGe semiconductor with a different ratio of silicon to germanium than the substrate 204.

The fins 206 may be formed by etching portions of the substrate 204, by depositing various layers on the substrate 204 and etching the layers, and/or by other suitable techniques. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 206 may be physically and electrically separated from each other by isolation features 208, such as a shallow trench isolation features (STIs). In various examples, the isolation features 208 include dielectric materials such as semiconductor oxides, semiconductor nitrides, semiconductor carbides, FluoroSilicate Glass (FSG), low-k dielectric materials, and/or other suitable dielectric materials.

Each device fin 206 may include any number of circuit devices, such as FinFETs, that, in turn, each include a pair of opposing source/drain features 210 separated by a channel region 212. The source/drain features 210 may include a semiconductor (e.g., Si, Ge, SiGe, etc.) and one or more dopants, such as p-type dopants (e.g., boron, $BF_2$, or indium) or n-type dopants (e.g., phosphorus or arsenic). Similarly, the channel region 212 may include a semiconductor and one or more dopants of the opposite type of those of the source/drain features 210.

The flow of carriers (electrons for an n-channel FinFET and holes for a p-channel FinFET) through the channel region 212 is controlled by a voltage (electrical potential) applied to a gate structure 214 adjacent to and overwrapping the channel region 212. To avoid obscuring other elements, the gate structures 214 are translucent in FIG. 2.

Figure 3:
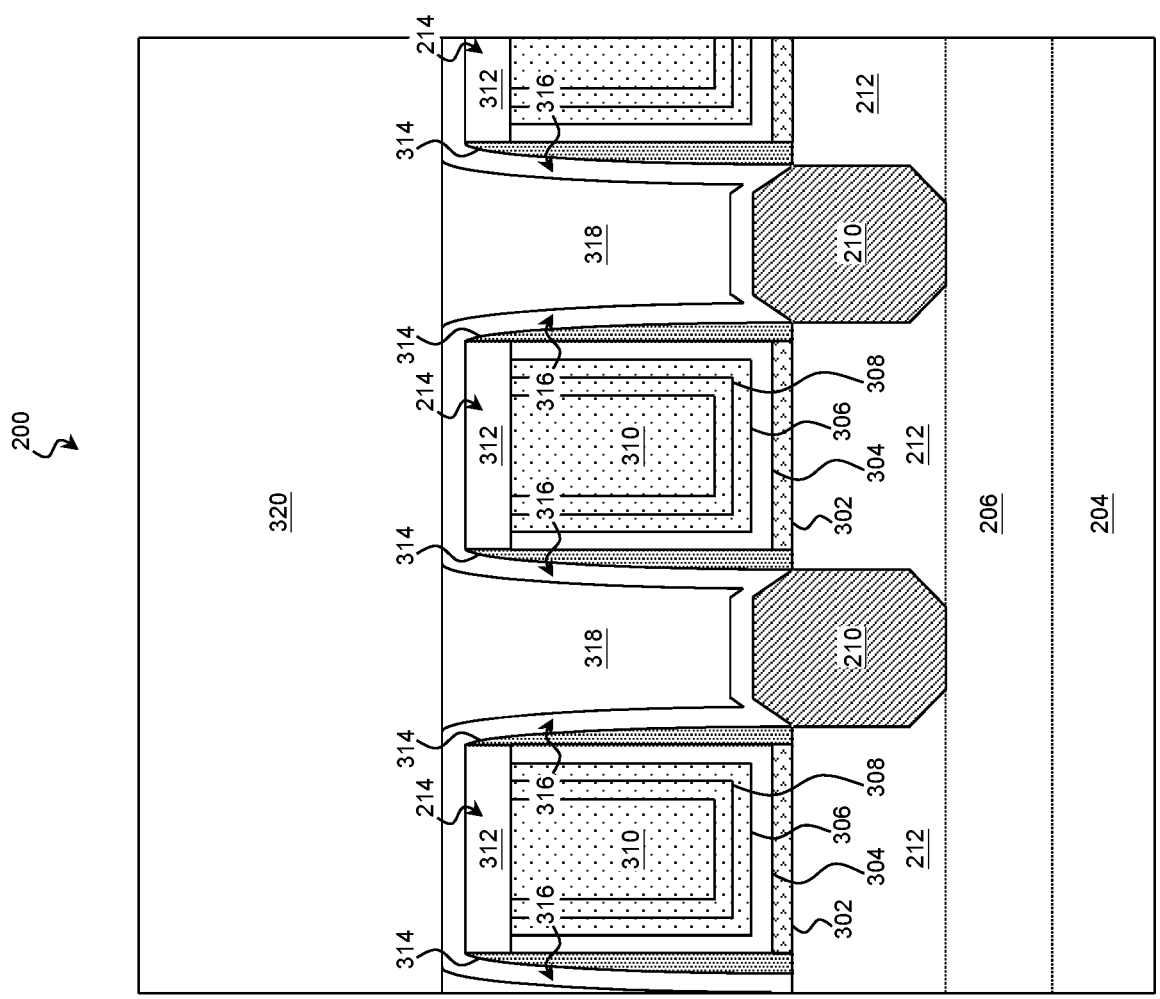
FIGS. 3-15 are fragmentary cross-sectional illustrations of the workpiece taken in a fin-length direction that cut through a fin according to various aspects of the present disclosure.

Referring to FIG. 3, a portion of the received workpiece 200 is shown in more detail. For example, the gate structure 214 is shown and includes, in some examples, an interfacial layer 302 disposed on the top and side surfaces of the channel regions 212. The interfacial layer 302 may include an interfacial material, such as a semiconductor oxide, semiconductor nitride, semiconductor oxynitride, other semiconductor dielectrics, other suitable interfacial materials, and/or combinations thereof.

The gate structure 214 may also include a gate dielectric 304 disposed on the interfacial layer 302. The gate dielectric 304 may also extend vertically along the sides of the gate structure 214. The gate dielectric 304 may include one or more dielectric materials, which are commonly characterized by their dielectric constant relative to silicon dioxide. In some embodiments, the gate dielectric 304 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 304 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 304 may be formed to any suitable thickness, and in some examples, the gate dielectric 304 has a thickness of between about 0.1 nm and about 3 nm.

A gate electrode is disposed on the gate dielectric 304. The gate electrode may include a number of different conductive layers, of which three exemplary types (a capping layer 306, work function layer(s) 308, and an electrode fill 310) are shown. With respect to the capping layer 306, it may include any suitable conductive material including metals (e.g., W, Al, Ta, Ti, Ni, Cu, Co, etc.), metal nitrides, and/or metal silicon nitrides. In various embodiments, the capping layer 306 includes TaSiN, TaN, and/or TiN.

The gate electrode may include one or more work function layers 308 on the capping layer 306. Suitable work function layer 308 materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof.

The gate electrode may also include an electrode fill 310 on the work function layer(s) 308. The electrode fill 310 may include any suitable material including metals (e.g., W, Al, Ta, Ti, Ni, Cu, Co, etc.), metal oxides, metal nitrides, and/or combinations thereof, and in an example, the electrode fill 310 includes tungsten.

In some examples, the gate structure 214 includes a gate cap 312 on top of the gate dielectric 304, the capping layer 306, the work function layer(s) 308, and/or the electrode fill 310. The gate cap 312 may include any suitable material, such as a dielectric material (e.g., a semiconductor oxide, a semiconductor nitride, a semiconductor oxynitride, a semiconductor carbide, a semiconductor oxycarbonitride, etc.), polysilicon, Spin On Glass (SOG), tetraethylorthosilicate (TEOS), Plasma Enhanced CVD oxide (PE-oxide), High-Aspect-Ratio-Process (HARP)-formed oxide, and/or other suitable material. In some examples, the gate cap 312 includes silicon oxycarbonitride. In some examples, the gate cap 312 has a thickness between about 1 nm and about 10 nm.

Sidewall spacers 314 are disposed on the side surfaces of the gate structures 214. The sidewall spacers 314 may be used to offset the source/drain features 210 and to control the source/drain junction profile. In various examples, the sidewall spacers 314 include one or more layers of suitable materials, such as a dielectric material (e.g., a semiconductor oxide, a semiconductor nitride, a semiconductor oxynitride, a semiconductor carbide, a semiconductor oxycarbonitride, etc.), SOG, TEOS, PE-oxide, HARP-formed oxide, and/or other suitable materials. In one such embodiment, the sidewall spacers 314 each include a first layer of silicon oxide, a second layer of silicon nitride disposed on the first layer, and a third layer of silicon oxide disposed on the second layer. In the embodiment, each layer of the sidewall spacers 314 has a thickness between about 1 nm and about 10 nm.

The workpiece 200 may also include a Bottom Contact Etch-Stop Layer (BCESL) 316 disposed on the source/drain features 210, on the gate structures 214, and alongside the sidewall spacers 314. The BCESL 316 may include a dielectric (e.g., a semiconductor oxide, a semiconductor nitride, a semiconductor oxynitride, a semiconductor carbide, etc.) and/or other suitable material. As the BCESL 316 provides protection from over etching during the etching of inter-level dielectric layers (described below), the composition of the BCESL 316 may be configured to have a different etch selectivity than the inter-level dielectric layers. In various embodiments, the BCESL 316 includes SiN, SiO, SiON, and/or SiC. The BCESL 316 may be formed to any suitable thickness, and in some examples, the BCESL 316 has a thickness between about 1 nm and about 20 nm.

One or more Inter-Level Dielectric (ILD) layers (e.g., layers 318 and 320) are disposed on the source/drain features 210 and gate structures 214 of the workpiece 200. The ILD layers 318 and 320 act as insulators that support and isolate conductive traces of an electrical multi-level interconnect structure. In turn, the multi-level interconnect structure electrically interconnects elements of the workpiece 200, such as the source/drain features 210 and the gate structures 214. The ILD layers 318 and 320 may include a dielectric material (e.g., a semiconductor oxide, a semiconductor nitride, a semiconductor oxynitride, a semiconductor carbide, etc.), SOG, FSG, PhosphoSilicate Glass (PSG), BoroPhosphoSilicate Glass (BPSG), Black Diamond®, Xerogel, Aerogel, amorphous fluorinated carbon, parylene, BCB, SiLK®, and/or combinations thereof. For ease of reference, the ILD layer 318 and the ILD layer 320 may be referred to as the first ILD layer and the second ILD layer, respectively.

Figure 4:
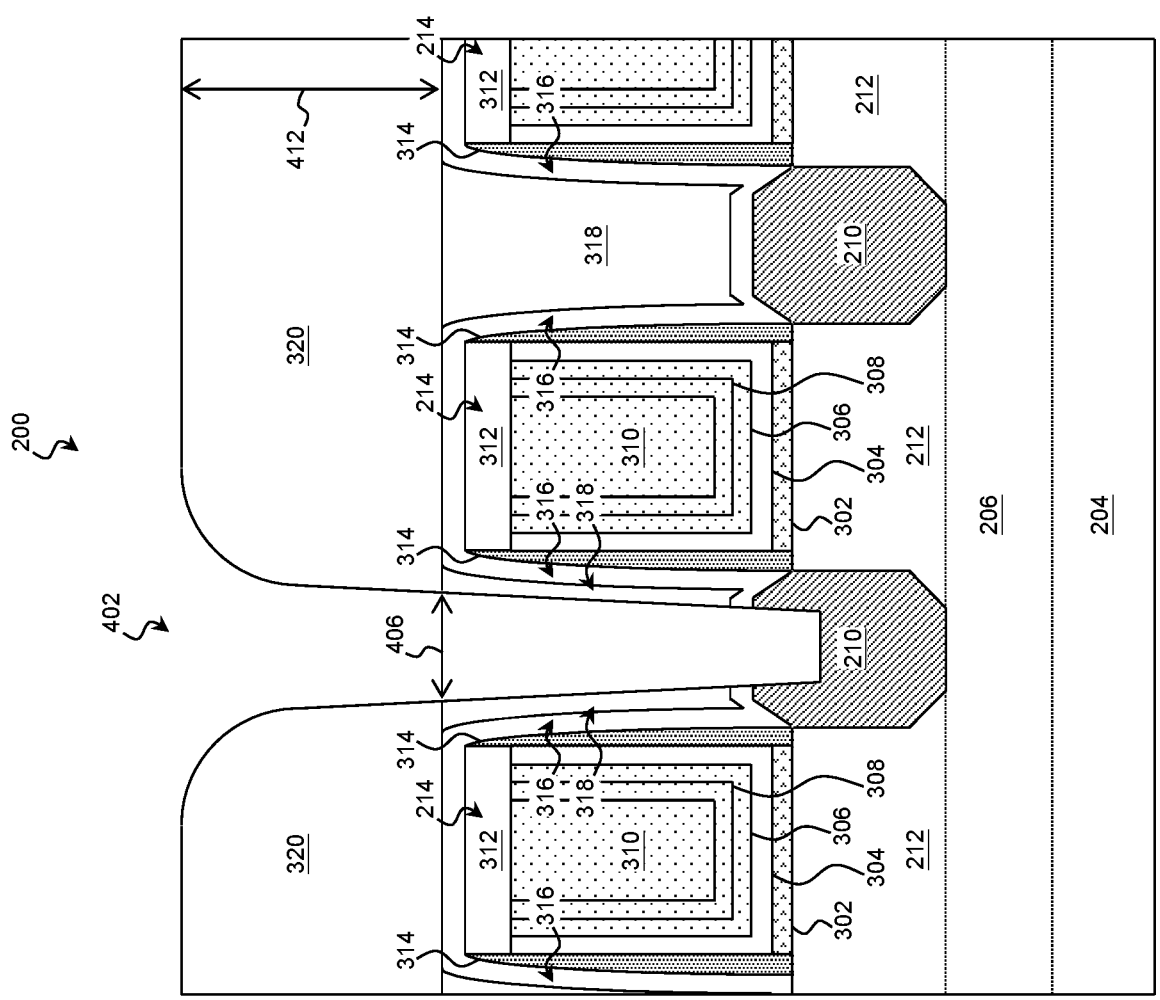

Referring to FIG. 4, the ILD layers 318 and 320 are etched to form recesses 402 for source/drain contacts. The recesses 402 expose the source/drain features 210 and 212 at locations where conductive features of the interconnect are to be formed. In some such examples, this includes forming a photoresist on the workpiece 200 and patterning the photoresist in a photolithographic process to selectively expose portions of the ILD layers 318 and 320 to etch. In one embodiment, a photolithographic system exposes the photoresist to radiation in a particular pattern determined by a mask. Radiation passing through or reflected off the mask strikes the photoresist thereby transferring a pattern formed on the mask to the photoresist. In other such embodiments, the photoresist is exposed using a direct write or maskless lithographic technique, such as laser patterning, e-beam patterning, and/or ion-beam patterning. Once exposed, the photoresist is developed, leaving the exposed portions of the resist, or in alternative examples, leaving the unexposed portions of the resist. An exemplary patterning process includes soft baking of the photoresist, mask aligning, exposure, post-exposure baking, developing the photoresist, rinsing, and drying (e.g., hard baking).

The portions of the ILD layers 318 and 320 exposed by the photoresist are then etched using any suitable etching technique such as wet etching, dry etching, RIE, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. The etching of the ILD layers 318 and 320 may be configured to further remove the exposed portions of the BCESL 316 or additional etching processes may be performed to open the BCESL 316.

The recesses 402 may have any suitable width, and in various embodiments, the width 406 of the recess 402 at a reference point, such as where the lower ILD layer 318 meets the upper ILD layer 320, is between about 15 nm and about 20 nm. The etching technique may be configured to produce recesses 402 with substantially vertical sidewalls. Conversely, in some embodiments, the etching technique may be configured to produce sidewalls that taper outward in a direction away from the substrate 204 (i.e., angle 408 being less than 90°). The tapered recesses 402 may reduce the occurrence of pinch-off, where deposition near the opening of a recess 402 seals the recess 402 before it is fully filled, and other adverse effects that may cause voids during the subsequent deposition processes that form the contacts. In some such embodiments, angle 408 is greater than or equal to 85° and less than 90°.

The etching technique may be configured to etch the material(s) of the ILD layers 318 and 320 and the BCESL 316 without significant etching of the surrounding materials. Additionally or in the alternative, in some examples, the etching technique is configured to etch a portion of the source/drain features 210 so that a contact formed in the recess will extend into the respective source/drain feature 210. The recesses 402 may extend any depth into the source/drain features 210, and in some examples, the recesses 402 extend between 1 nm and about 5 nm below the top surface of the source/drain features as indicated by marker 410. Any remaining photoresist may be removed after etching the recesses 402. For reference, the thickness 412 of the ILD layer 320 above the top of the BCESL 316 may be between about 50 nm and about 100 nm after the photoresist removal process.

An optional etching process may be performed on the topmost portion of the upper ILD layer 320 to round the corners of the recesses 402 and thereby widen the uppermost portions of the recesses 402. This may further reduce the likelihood of pinch-off and rectify other causes of fill irregularities. The topmost portions of the upper ILD layer 320 may be etched using any suitable etching technique, such as wet etching, dry etching, RIE, and/or other etching methods, and the etching technique may be configured to avoid significant etching of the surrounding materials, such as the lower ILD layer 318, the source/drain features 210, and/or the BCESL 316. The etching may reduce the thickness 412 of the upper ILD layer 320 above the top of the BCESL 316 by between about 5 nm and about 20 nm (e.g., between about 10% and about 20%), and the thickness 412 of the ILD layer 320 may be between about 40 nm and about 90 nm at the end of the optional etching process. In some such examples, the width 406 of the recess 402 at the interface between the ILD layers 318 and 320 remains between about 15 nm and about 20 nm at the end of the optional etching process.

Figure 5:
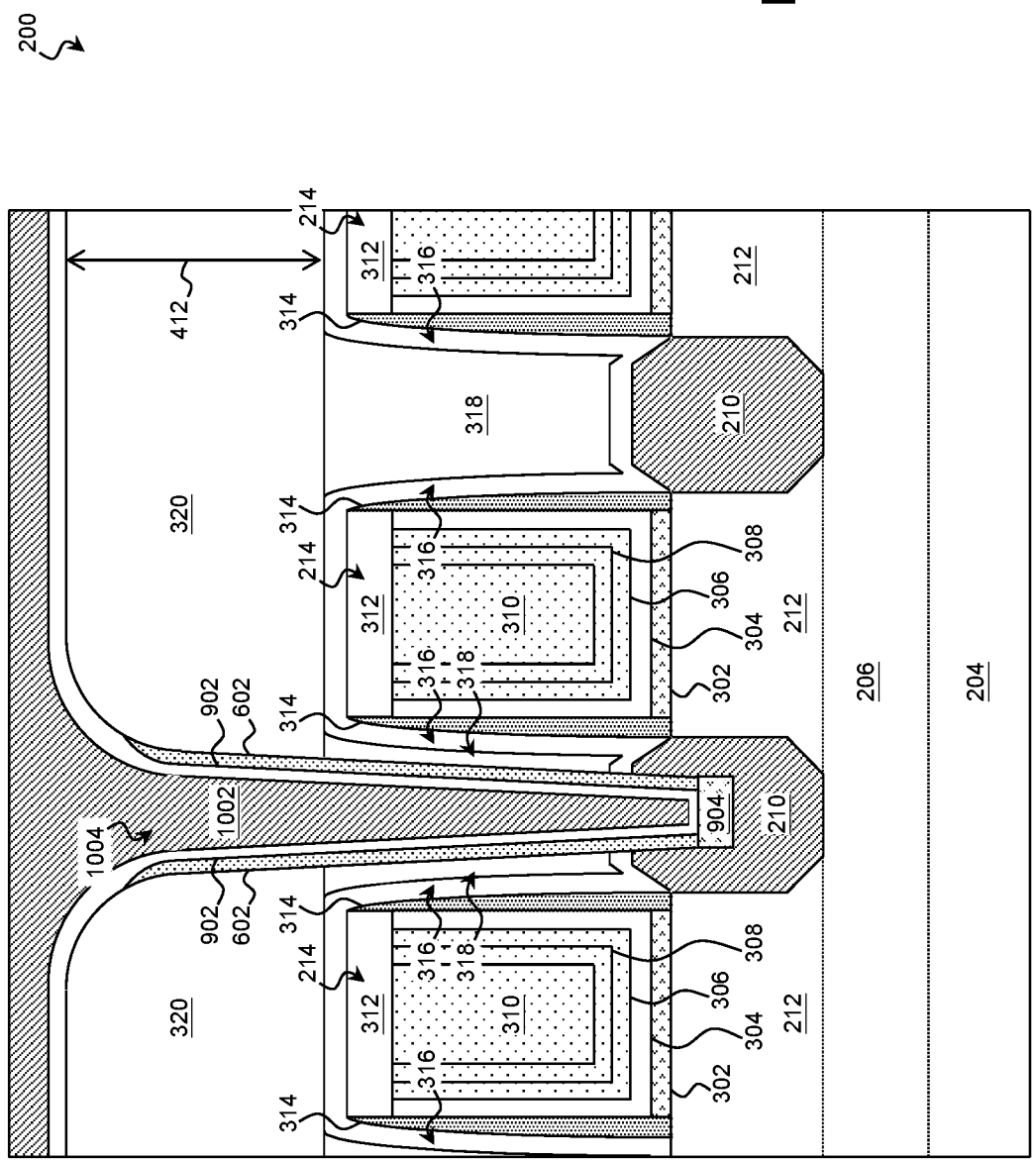

Referring to block 104 of FIG. 1A and to FIG. 5, a contact fill 1002 is deposited on the workpiece 200 within the recesses 402 to define source/drain contacts 1004. The contact fill 1002 may be deposited by any suitable technique including ALD, PEALD, CVD, PE CVD, Physical Vapor Deposition (PVD), and/or combinations thereof. The contact fill 1002 may include any suitable material including metals (e.g., Ru, Pt, Au, Co, W, Al, Ta, TaN, Ti, Ni, NiPt, Cu, etc.), metal oxides, metal nitrides and/or combinations thereof, and in an example, the contact fill 1002 includes ruthenium (Ru). Moreover, while the contact fill 1002 is illustrated in FIG. 5 as one layer, the contact fill 1002 may include more than one material layers, such as two material layers or three material layers. In some implementations, the contact fill 1002 may include a cobalt (Co) layer and a ruthenium (Ru) layer over the cobalt (Co) layer. In some other implementations, the contact fill 1002 may also include an additional tungsten (W) layer between the cobalt (Co) layer and the ruthenium (Ru) layer.

To prevent the contact fill 1002 from being oxidized due to contact with oxygen-containing ILD layers 318 and 320, a dielectric contact liner 602 is deposited on the side surfaces of the recess 402. The dielectric contact liner 602 may include a dielectric material (e.g., a semiconductor oxide, a semiconductor nitride, a semiconductor oxynitride, a semiconductor carbide, a semiconductor oxycarbonitride, etc.) and/or other suitable material. In some examples, the dielectric contact liner 602 includes a semiconductor nitride (e.g., SiN). The dielectric contact liner 602 may be deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. The dielectric contact liner 602 may be formed to any suitable thickness, and in various such examples, the dielectric contact liner 602 is formed by an ALD process to have a thickness between about 1 nm and about 5 nm as deposited.

The horizontal portions of the deposited dielectric contact liner 602 are removed using a directional etching technique. The etching may be configured so that the vertical portions of the dielectric contact liner 602 remain on the side surfaces of the ILD layers 318 and 320, the BCESL 316, and/or the source/drain features 210. The horizontal portions of the dielectric contact liner may be etched using any suitable etching technique including anisotropic dry etching, wet etching, RIE, and/or other anisotropic etching techniques. In some embodiments, the etching process includes high-density plasma dry etching using a combination of $CH_3F$, COS (carbonyl sulfide), and $H_2$. The particular etching technique may be configured to avoid significant etching of the ILD layers 318 and 320 and the source/drain feature 210. However, in some examples, the thickness 412 of the ILD layer 320 above the BCESL 316 is reduced by between about 1 nm and about 5 nm. Accordingly, the thickness 412 of the ILD layer 320 may be between about 40 nm and about 90 nm at the end of the directional etching process. In some such examples, the width 406 of the recess 402 at the interface of the ILD layers 318 and 320 may be between about 10 nm and about 15 nm at the end of the directional etching process.

The workpiece 200 is cleaned prior to forming a conductive contact liner to remove native oxides and other contaminants. The cleaning process may use any suitable wet cleaning or dry cleaning process, and in some examples, this includes a wet clean where de-ionized water (DI), SC1 (DI, NH$_4$OH, and/or H$_2$O$_2$), SC2 (DI, HCl, and/or H$_2$O$_2$), ozonated de-ionized water (DIWO$_3$), SPM (H$_2$SO$_4$ and/or H$_2$O$_2$), SOM (H$_2$SO$_4$ and/or O$_3$), SPOM, H$_3$PO$_4$, dilute hydrofluoric acid (DHF), HF, HF/ethylene glycol (EG), HF/HNO$_3$, NH$_4$OH, tetramethylammonium hydroxide (TMAH), etc. are applied to the workpiece 200 including within the recesses 402. The workpiece 200 and/or wet cleaning solution may be agitated using ultrasonic energy or any other technique to facilitate the cleaning process. Likewise, heat may be applied to promote the cleaning. The cleaning may reduce the thickness 412 of the ILD layer 320 above the top of the BCESL 316 by between about 5 nm and about 20 nm (e.g., between about 10% and about 20%), and the thickness 412 of the ILD layer 320 may be between about 30 nm and about 80 nm at the conclusion of the cleaning process.

A contact liner precursor may be formed on the side and bottom surfaces of the recesses 402. The contact liner precursor may form a liner that promotes adhesion between a contact fill material and a remainder of the workpiece 200. The contact liner precursor may also act a barrier that prevents material of the contact from diffusing into the workpiece 200. In some examples, the contact liner precursor also forms a silicide at an interface with the source/drain features 210. Accordingly, the contact liner precursor may include any suitable conductive material including metals (e.g., Ti, Ta, Co, W, Al, Ni, Cu, Co, etc.), metal nitrides, metal silicon nitrides, and/or other suitable materials. In one such embodiment, the contact liner precursor includes Ti. The contact liner precursor may be deposited using ALD, PEALD, CVD, PECVD, HDP-CVD, and/or other suitable deposition processes. The contact liner precursor may be formed to any suitable thickness and, in various examples, is formed by a CVD process to have a thickness between about 1 nm and about 5 nm.

In some embodiments, before the contact fill 1002 is deposited, the workpiece 200 is annealed to convert the contact liner precursor into a contact liner 902. To do so, the annealing process may introduce nitrogen into the contact liner precursor from ambient N$_2$ and/or NH$_3$ present during the annealing. In an example, the annealing converts a contact liner precursor that is predominantly Ti into a contact liner 902 that includes TiN. The annealing process may also cause a metal or other conductive material to diffuse from the contact liner precursor into a source/drain feature 210 to form a silicide feature 904 between the remaining source/drain feature 210 and the contact liner 902. The silicide feature 904 may reduce the resistance at the interface between the source/drain feature 210 and the contact liner 902. In one such example, the annealing causes titanium to diffuse from the contact liner precursor to form a silicide feature 904 that includes TiSi$_x$. The silicide feature 904 may have any suitable thickness, and in some examples is between about 1 nm and about 5 nm thick. In various examples, the annealing process heats the workpiece 200 to between about 350° C. and about 500° C. for between about 30 seconds and about 5 minutes in an environment containing N$_2$ and/or NH$_3$ to form the contact liner 902 and the silicide feature 904. The source/drain contact 1004 includes the contact liner 902 and the contact fill 1002 in contact with the contact liner 902.

Figure 6:
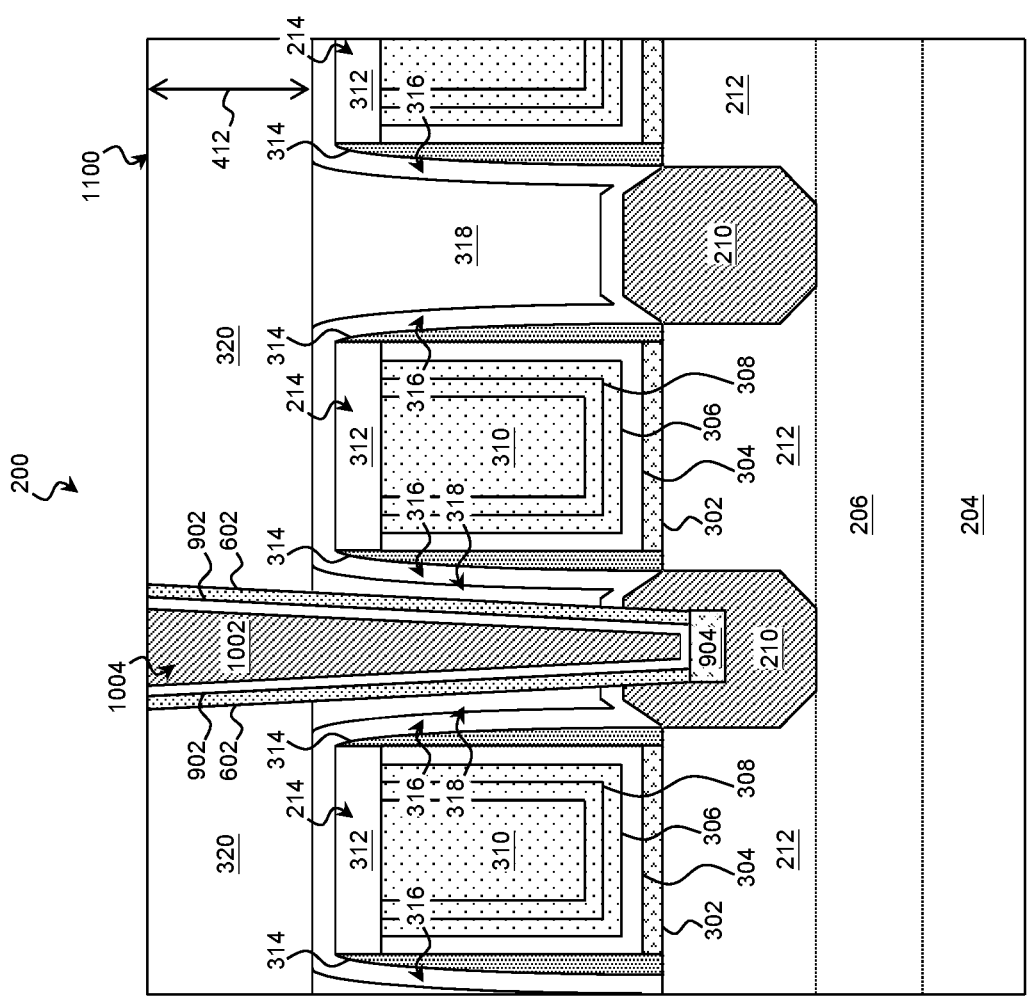

Referring to block 106 of FIG. 1A and to FIG. 6, a planarization process, such as a Chemical Mechanical Planarization/Polishing (CMP) process, may be performed following the deposition of the contact fill 1002 to planarize the ILD layer 320, the dielectric contact liner 602, the contact liner 902, and the contact fill 1002, to form a planar surface 1100. While the planarization process, such as CMP, may tend to produce a substantially coplanar top surface, in many examples not shown in FIG. 6, some materials, such as the contact fill 1002, may be recessed more than others. For reference, the thickness 412 of the ILD layer 320 above the top of the BCESL 316 may be between about 20 nm and about 30 nm at the conclusion of block 106.

Figure 7:
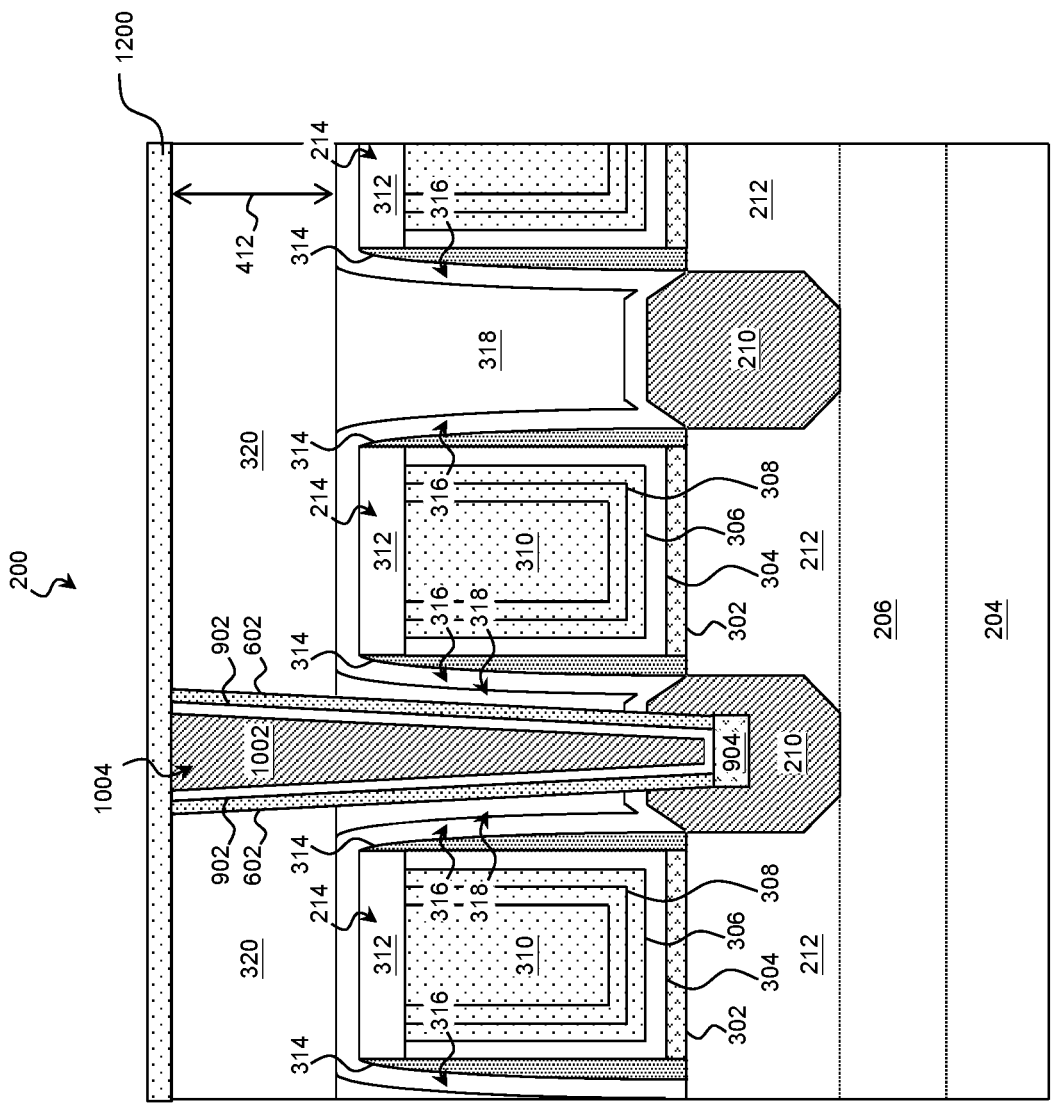

Referring to block 108 of FIG. 1A and to FIG. 7, a Middle Contact Etch-Stop Layer (MCESL) 1200 is formed on the ILD layer 320 and on the contact fill 1002. The MCESL 1200 may include a dielectric (e.g., a semiconductor oxide, a semiconductor nitride, a semiconductor oxynitride, a semiconductor carbide, etc.) and/or other suitable material, and in various embodiments, the MCESL 1200 includes SiN, SiO, SiON, and/or SiC. The MCESL 1200 may be deposited using ALD, PEALD, CVD, PECVD, HDP-CVD, and/or other suitable deposition processes. The MCESL 1200 may be formed to any suitable thickness, and in various such examples, the MCESL 1200 is formed using CVD to a thickness between about 1 nm and about 20 nm with the mesa protruding between about 1 nm and about 5 nm above the remainder of the MCESL 1200.

Figure 8:
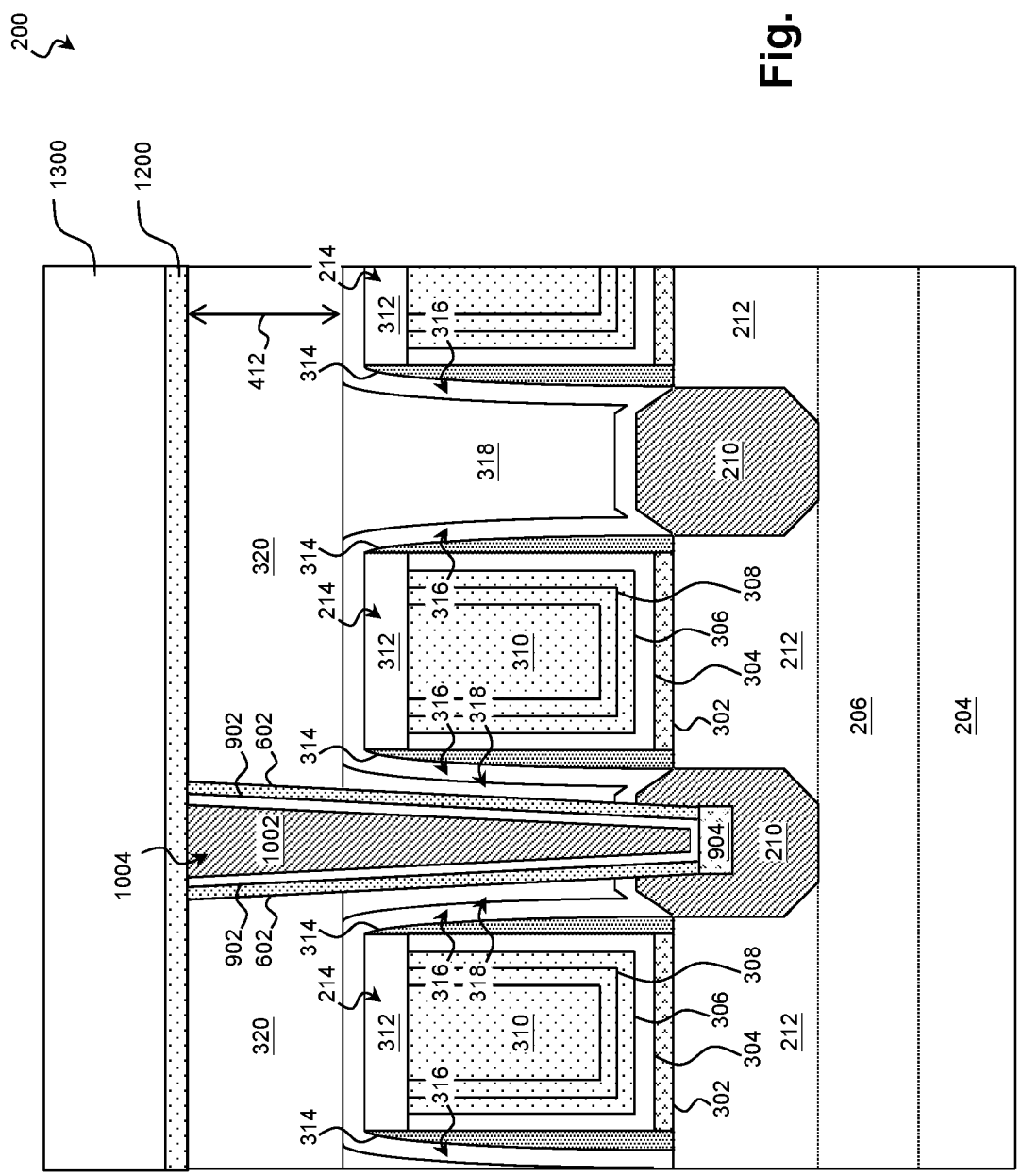

Referring to block 110 of FIG. 1A and referring still to FIG. 8, a third ILD layer 1300 (with the ILD layer 318 being the first ILD layer and the ILD layer 320 being the second ILD layer) is formed on the MCESL 1200. The third ILD layer 1300 may include a dielectric material (e.g., a semiconductor oxide, a semiconductor nitride, a semiconductor oxynitride, a semiconductor carbide, etc.), SOG, FSG, PSG, BPSG, Black Diamond®, Xerogel, Aerogel, amorphous fluorinated carbon, parylene, BCB, SiLK®, and/or combinations thereof. The third ILD layer 1300 may be deposited using ALD, PEALD, CVD, PECVD, HDP-CVD, PVD, spin-on deposition, and/or other suitable deposition processes. The third ILD layer 1300 may be formed to any suitable thickness, and in various examples, the third ILD layer 1300 is between about 50 nm and about 100 nm thick.

Figure 9:
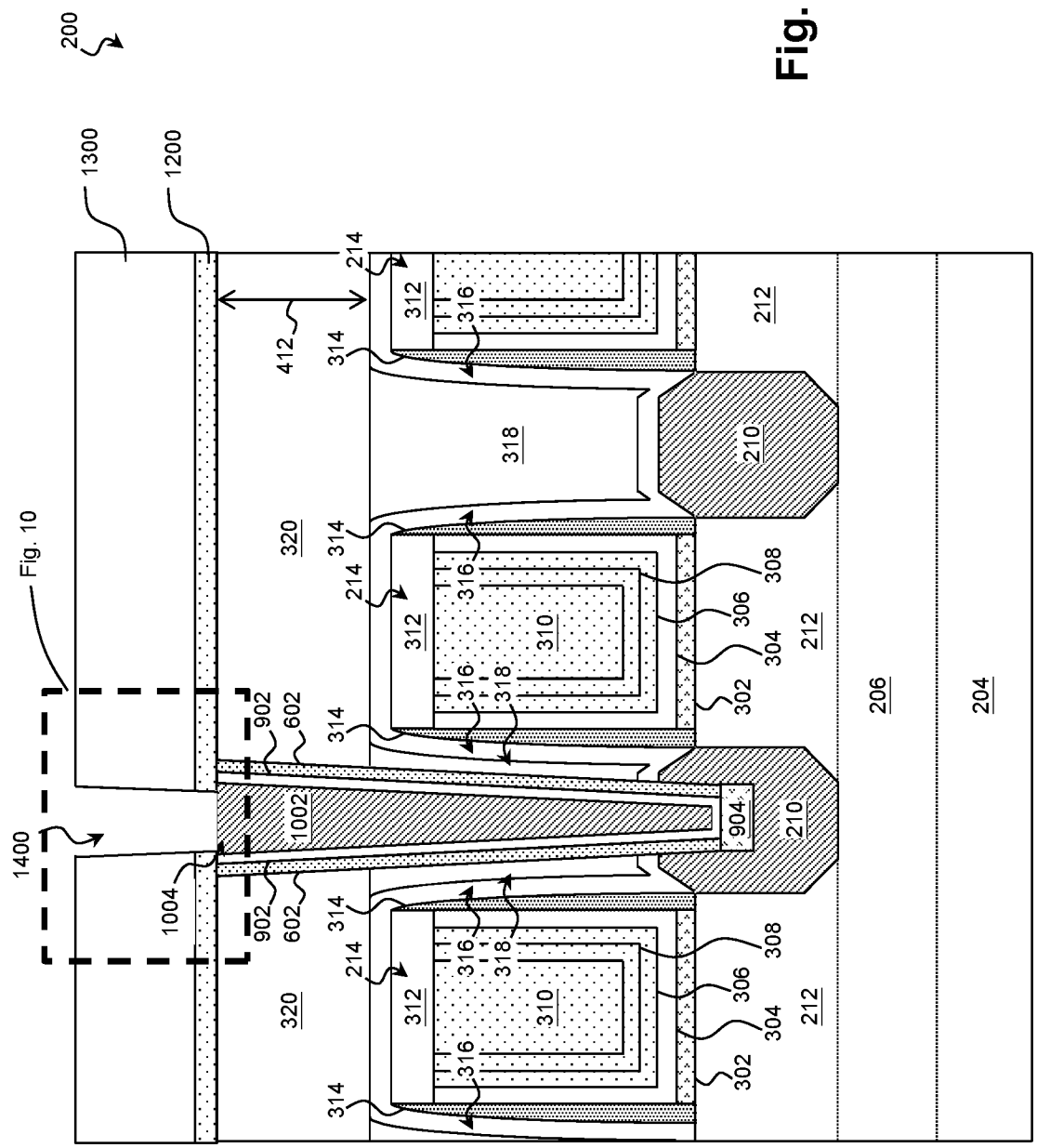

Referring to block 112 of FIG. 1A and to FIG. 9, the ILD layers 320 and 1300 are etched to form a recess 1400 for a contact that couples to the existing source/drain contact 1004. While not shown, at block 112, recesses may also be formed for contacts that couple to the gate structures 214. This etch process may include one or more iterations of: forming a photoresist on the workpiece 200, patterning the photoresist, and etching the exposed portions of the ILD layers 320 and 1300, and the MCESL 1200. Any remaining photoresist may be removed after etching the recesses 1400. In the embodiment represented in FIG. 9, the contact fill 1002 is exposed though a bottom surface of the recess 1400.

Blocks 114, 114A, 114B, and 114C in FIG. 1B are mainly relating to operations performed on the source/drain contact 1004 and adjacent structures and will be described with reference to FIGS. 10-15, which illustrate enlarged cross-sectional views of the dotted rectangular area marked in FIG. 9.

Figure 10:
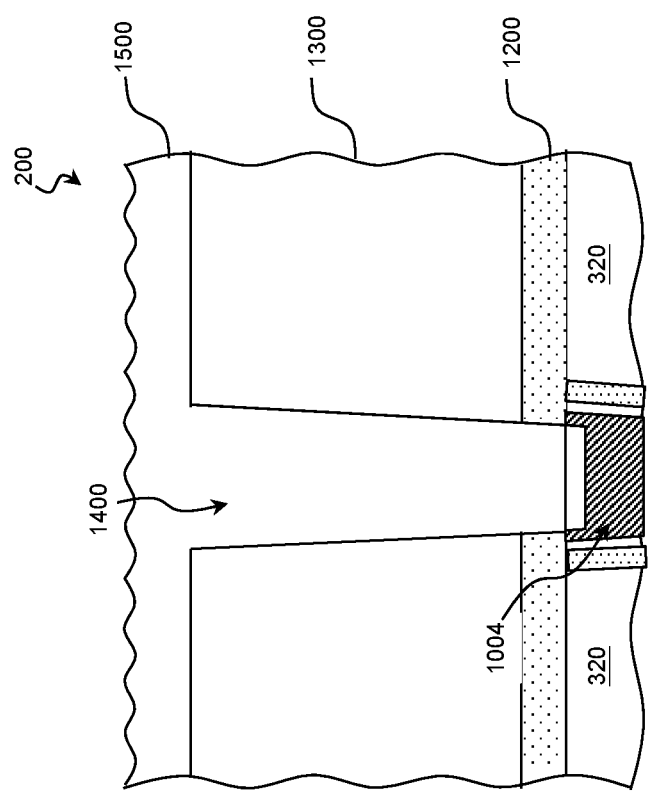

Referring to block 114 of FIG. 1B and FIG. 10, in some embodiments, the workpiece 200 is soaked in or put in contact with a room temperature ionic liquid (RTIL) 1500 such that the exposed portion of the contact 1004, such as the contact fill 1002, is etched back to lower contact resistance to another conductive feature overlying the contact 1004. In some instances, the soaking temperature is between about 5° C. and about 100° C. This etch-back process can also be referred to as a pull-back or a recess process. In some implementations, the room temperature ionic liquid 1500 includes at least one species of cations and at least one species of anions. In some embodiments, the at least one species of cations may be selected from imidazolium, pyridinium, pyrrolidinium, phosphonium, ammonium, sulfonium, and the like. In some instances, the at least one species of cations may include more than one of the foregoing cations. In some embodiments, the at least one species of anions may be selected from alkylsulfate, tosylate, methanesulfonate, bis(trifluoromethyl-sulfony)imide, hexafluorophosphate, tetrafluoro-borate, halide, and the like. In some instances, the at least one species of anions may include more than one of the foregoing anions. In some embodiments, the room temperature ionic liquid 1500 may include a bulky cation and a small anion. For example, the room temperature ionic liquid 1500 may include relatively more bulky 1-butyl-3-methyl imidazolium (BMI) as a cation and relatively small hexafluorophosphate ($PF_6$) as an anion. In this example, the room temperature ionic liquid may be referred to as $BMIPF_6$ solution. In some alternative embodiments, the room temperature ionic liquid 1500 may include a small cation and a bulky anion. The room temperature ionic liquid 1500 is in liquid form at room temperature, such as below about 100° C. The room temperature ionic liquid 1500, as used in embodiments of the present disclosure, functions both as a solvent and a source of chelating agent. In this regard, the room temperature ionic liquid 1500 may function as a solvent to dissolve the material forming the contact because the anions and cations therein functions as chelating agents that stabilize the ionic forms of the material in the room temperature ionic liquid 1500.

At block 114, the material forming the contact fill 1002, such as cobalt, tungsten and ruthenium, is soluble in the room temperature ionic liquid 1500 in its ionic forms and may be removed from a top surface (i.e. the surface exposed to the room temperature ionic liquid) of the contact fill 1002. In cases where the top surface of the contact fill 1002 includes ruthenium (Ru) and the room temperature ionic liquid 1500 is $BMIPF_6$, Ru ions (such as Ru (III)) from Ru on the top surface of the contact fill may be dynamically chelated and stabilized by the BMI cations and the $PF_6$ anions in the $BMIPF_6$ solution. Because the room temperature ionic liquid 1500 according to the present disclosure does not contain any oxygen items, the operations in block 114 involve no oxygen source that may oxidize the material forming the top surface of the contact fill 1002. Again, in the examples where the top surface of the contact fill 1002 includes Ru and the room temperature ionic liquid is $BMIPF_6$, dissolving Ru in $BMIPF_6$ does not produce any ruthenium oxide, such as ruthenium (IV) oxide ($RuO_2$) and ruthenium (VIII) oxide (RuO4). As described above, $RuO_2$ not only may increase contact resistance with an overlying contact or conductive feature and but also may be a source of contaminating particles; and $RuO_4$ is toxic and may require additional equipment for safe disposal. Generally speaking, the room temperature ionic liquid 1500 does not affect the third ILD layer 1300. Because the non-metallic third ILD layer 1300 does not give up metal ions, the third ILD layer 1300 is not soluble in the room temperature ionic liquid 1500 and thus is not etched when put in contact with the room temperature ionic liquid 1500. In some instances, a portion of the contact liner 902 may also be exposed in the recess 1400 and may be soluble in the room temperature ionic liquid 1500. In those instances, the contact liner 902 may be recessed at block 114 as well.

In some embodiments, at least a species of ligand (i.e. complexing agent) may be optionally added into the room temperature ionic liquid 1500 to increase a rate at which the contact fill 1002 is recessed. Examples of such ligands may include benzotriazole or bipyridine, including, for example:

(1) 2,2'-bipyridine

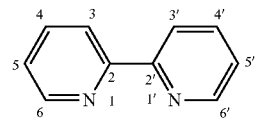

(2) 2,3'-bipyridine

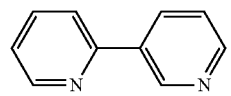 [SMILES: c1ccc(-c2cccnc2)nc1]

(3) 2,4'-bipyridine

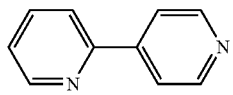

(4) 3,3'-bipyridine

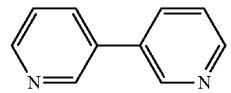 [SMILES: c1cncc(-c2cccnc2)c1]

(5) 3,4'-bipyridine

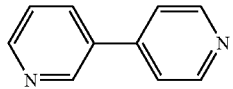

(6) 4,4'-bipyridine

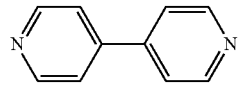 [SMILES: c1cc(-c2ccncc2)ccn1]

The ligand may form complexes with different forms of ions of the material forming the contact fill 1002. For example, when the contact fill 1002 is formed of ruthenium and the ligand species is bipyridine, bipyridine can coordinate with ruthenium ions, such as ruthenium (III) ions, thereby stabilizing the ruthenium ions and facilitating the recessing of the contact fill 1002.

Figure 11:
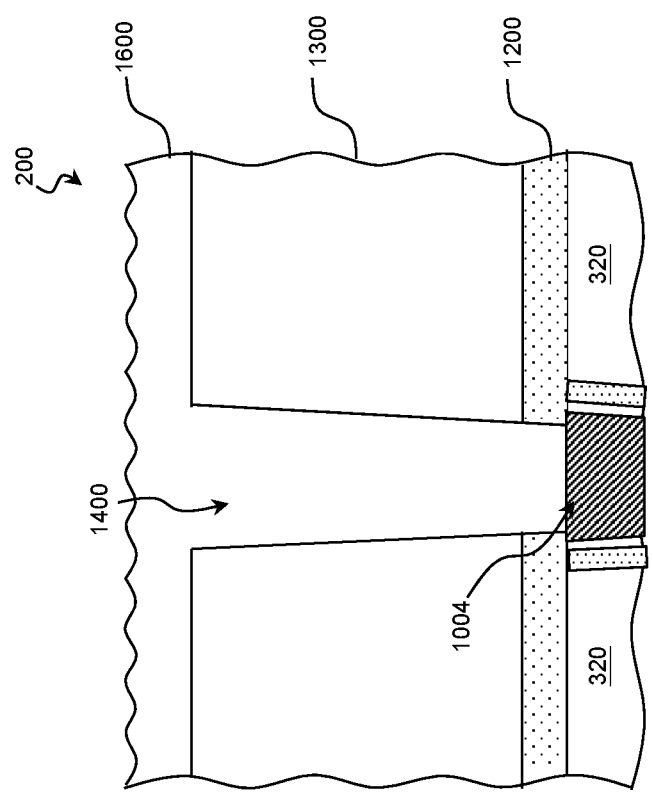
Figure 12:
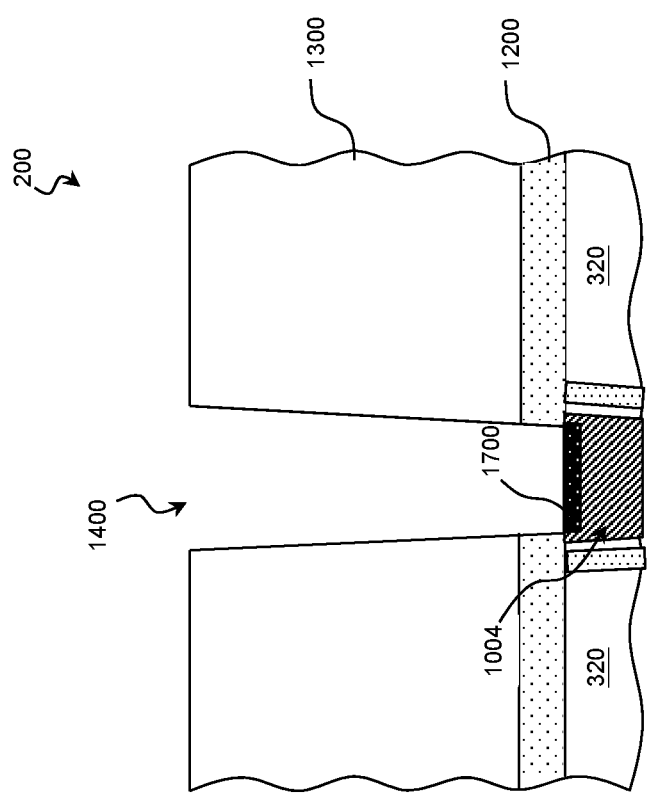
Figure 13:
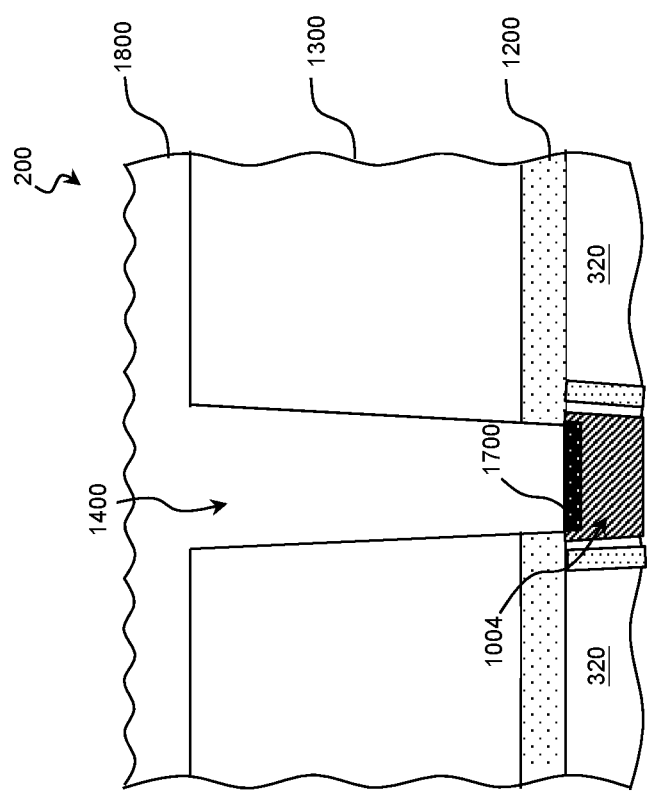
Figure 14:
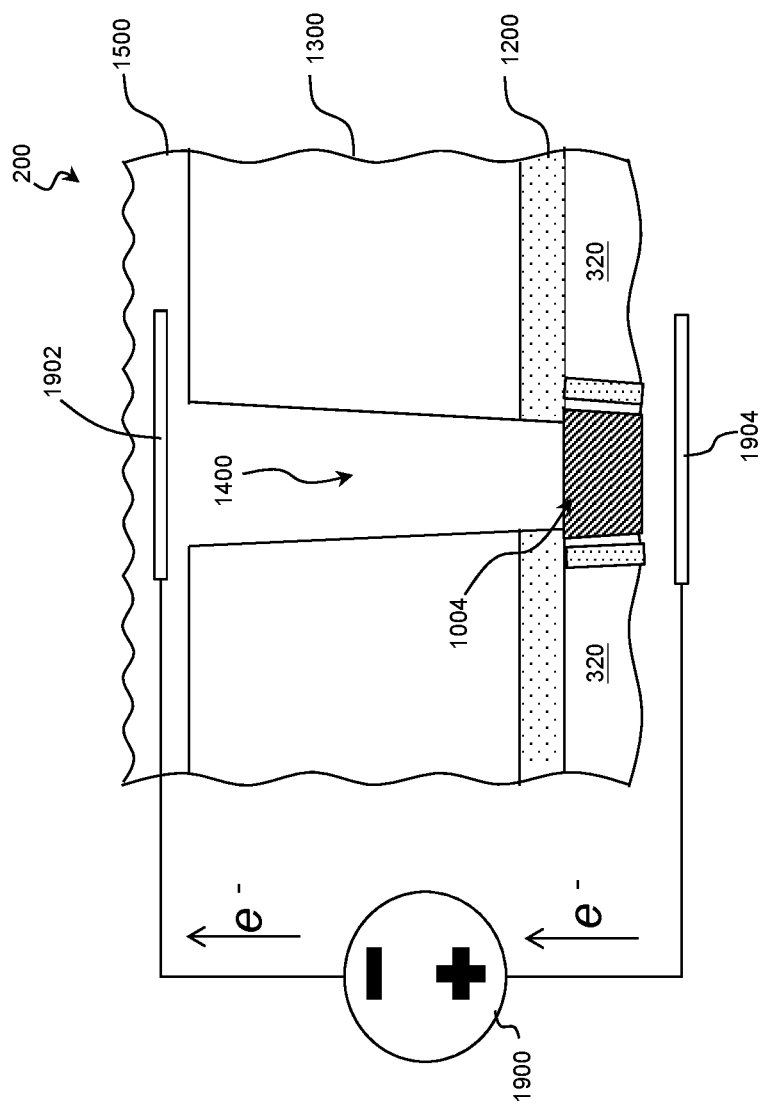

In some alternative embodiments, the room temperature ionic liquid 1500 may be used in conjunction with an oxidizer in a digital etch process. In some implementations, the digital etch process may include an oxidization step and a dissolution step. For that reason, the digital etch process according to these alternative embodiments may be referred to as a two-step digital etch process. The contact fill 1002 exposed in the recess 1400 may be oxidized by an oxidizer in the oxidization step and then oxides from the oxidization step may be dissolved in the room temperature ionic liquid or a solution of ligands and room temperature ionic liquid. An optional oxidizer removal sub-step may be included between these two steps to avoid any ligand introduced in the dissolution step from being oxidized by any leftover or excess oxidizer. These alternative embodiments are illustrated in blocks 114A, 114B and 114 of FIG. 1B (the "chemical oxidation" box on the left hand side) and FIGS. 10, 11, 12, and 13. FIGS. 11, 12 and block 114A illustrate and describe the oxidization step. FIG. 13 and block 114B illustrate and describe the oxidizer removal sub-step. FIG. 10 and Block 114 illustrate and describe the dissolution step. Each cycle of the oxidization step and the dissolution step can remove a top layer of the contact fill 1002 to recess the contact 1004. In some instances, the extent of the recess of contact 1004 is substantially proportional to the number of cycles performed to the contact 1004. If a more substantial recess of the contact 1004 is necessary, more than one cycle of the two-step digital etch may be performed.

Referring now to block 114A and FIGS. 11 and 12, optionally the workpiece 200 from the block 112 may be allowed to be in contact with an oxidizer solution 1600 that includes an oxidizer such as ceric ammonium nitrate (CeAN or CAN), hydrogen peroxide, or periodic acid, $F_2/F-$, $Br_2/Br-$, $I_2/I-$, $I_3/I-$, $Cl_2/Cl-$, $Fe(C_5H_5)_2$ (ferrocene), benzoquinone (1,4-benzoquinone), catechol (1,2-benzoquinone), and 1,4-Napthoquinone. As shown in FIG. 11, the oxidizer in the oxidizer solution 1600 oxidizes a top surface of the contact fill 1002 to form oxide 1700 (FIG. 12). Depending on the material forming the contact fill 1002, the oxide 1700 may include different oxides. For example, when the contact fill 1002 is formed of ruthenium, the oxide 1700 may include ruthenium oxide ($RuO_x$, such as $RuO_2$). In some implementations, the amount of oxidizer in the oxidizer solution 1600 is smaller than the stoichiometric amount necessary to react with the exposed surfaces of the contact fill 1002 such that all or substantially all of the oxidizers in the oxidizer solution 1600 is consumed once the oxidizer solution 1600 is allowed to react with the contact fill 1002. After the oxidizer is allowed to react with the contact fill 1002 for an amount of time suitable for the oxidizer-contact fill material combination, the oxidizer solution 1600 is drained. In some implementations, the recess 1400 may also expose a portion of the contact liner 902. In those implementations, the oxidizer in the oxidizer solution 1600 may react with the material forming the contact liner 902. For example, when the contact liner 902 is formed of titanium, the oxidization of the contact liner 902 may produce titanium oxide ($TiO_x$, such as $TiO_2$).

In these alternative embodiments, residual oxidizer may still be present on the workpiece 200 after the oxidizer solution 1600 is drained and may oxidize ligands (if added) in the room temperature ionic liquid, thus reducing the amount of ligand that may stabilize metal ions by complexation. As illustrated in block 114B of FIG. 1B and FIG. 13, to remove leftover oxidizer from the workpiece 200, an oxidizer removal sub-step may be performed by rinsing the workpiece 200 with a rinse liquid 1800 to remove all or substantially all of the oxidizer left on the workpiece 200. In some instances, the rinse liquid 1800 may be a room temperature ionic liquid, such as the room temperature ionic liquid 1500. It is noted, however, that the rinse liquid 1800 does not include any ligand and this oxidizer removal sub-step is needed if at least one species of ligand is to be added to the room temperature ionic liquid in the dissolution step. The oxidizer removal sub-step in block 114B may reduce the probability any ligand being oxidized by any residual oxidizer.

Reference is now made to block 114 of FIG. 1B and FIG. 10. Following the oxidization step in block 114A (or the oxidizer removal sub-step in block 114B, if performed), the workpiece 200 may undergo the dissolution step at block 114, where the oxide 1700 and any exposed portion of the contact 1004 (such as top surfaces of the contact liner 902 or the contact fill 1002) is soaked in the room temperature ionic liquid 1500, as shown in FIG. 10. Because the dissolution step in the two-step digital etch process includes essentially soaking the workpiece 200 in the room temperature ionic liquid 1500 (with or without optional ligand addition), the same block 114 and FIG. 10 are used for illustration of the dissolution step in the alternative embodiments. In some instances, the soaking temperature is between about 5° C. and about 100° C. At the dissolution step illustrated in block 114, the oxide 1700 (not shown in FIG. 10, but shown in FIGS. 12 and 13) and any exposed portions of the contact 1004 (including the contact liner 902 and the contact fill 1002) may be dissolved in the room temperature ionic liquid 1500 and removed, thereby recessing (or etching back) the contact 1004.

In further alternative embodiments of the present disclosure, chemical oxidization may be replaced by an anodic oxidation process (or an electrochemical etch process, electro-etching process). In the anodic oxidation process, the material of the contact 1004 being recessed, is not oxidized through a chemical reaction with an oxidizer, but at an anode due to an electrical potential. These further alternative embodiments of the method 100 are illustrated in blocks 114 and 114C of FIG. 1B (the "anodic oxidation" box on the right hand side) and FIG. 14. For the electrochemical process, the workpiece 200 is soaked in the room temperature ionic liquid 1500 at block 114 of FIG. 1B, as shown in FIG. 10. In some instances, the soaking temperature is about 5° C. and about 100° C. Referring now to block 114C of FIG. 1B and FIG. 14, an electrical potential (a voltage) is applied between the contact 1004 (i.e. the top surface of the contact fill 1002 in FIG. 14) as the anode and a cathode 1902. In some implementations, the cathode 1902 may be a plate or a plate like structure that is formed of a conductive material. In some instances, the cathode 1902 is formed of the same material of the contact fill 1002. For example, when the contact fill 1002 is formed of ruthenium, the cathode 1902 is also formed of ruthenium. In some other instances, the cathode 1902 may be formed of a different metal, such as platinum (Pt), titanium (Ti) or tantalum (Ta). The cathode 1902 and the anode (contact fill 1002) are electrically coupled to a power supply 1900 that receives electrons from the anode and supplies electrons to the cathode 1902. In some implementations, the power supply 1900 may be a direct current (DC) current source that applies an electrical potential between about 0.1 volt and 3 volt relative to a standard hydrogen electrode (SHE). In some alternative implementations, the power supply 1900 may be an alternating current (AC) power source that provides a pulsed current. To prevent decomposition of the room temperature ionic liquid 1500, a DC voltage or a peak-to-peak amplitude of an AC pulse supplied by the power supply 1900 may not exceed the decomposition voltage of the room temperature ionic liquid 1500. Other embodiments of the power supply 1900 are possible. The anode (contact fill 1002) may be electrically coupled to the power supply 1900 via an anode 1904. The anode 1904 may be or in electrical communication with a contact via structure, a metal line structure, a through-substrate via, or a combination thereof.

In still further alternative embodiments, the anodic oxidation process described above in conjunction with blocks 114 and 114C of FIG. 1B may replace the oxidization step of the two-step digital etch process described above. In these embodiments, the anodic oxidation process at block 114C may be performed before the dissolution step where the workpiece 200 is soaked in the room temperature ionic liquid 1500 at block 114. In some embodiments, the soaking temperature is between about 5° C. and about 100° C.

Figure 15:
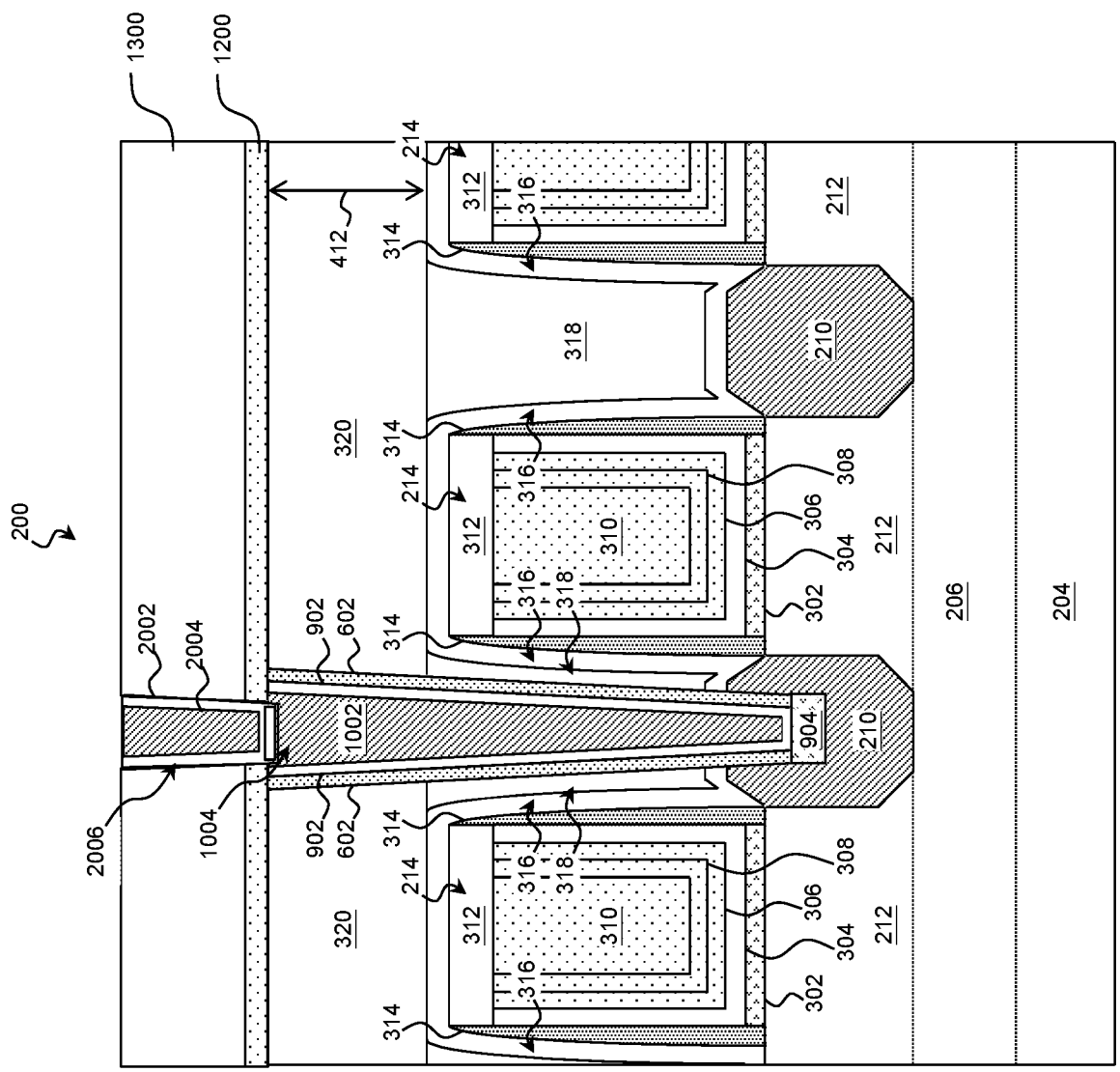

Referring to block 116 of FIG. 1B and FIG. 15, the workpiece 200 may be provided for further fabrication. This includes forming a remainder of an electrical interconnect structure, dicing, packaging, and other fabrication processes. For example, after the contact 1004 (such as the contact fill 1002) is recessed in processes illustrated in block 114, 114A, 114B, 114C, or combinations thereof as described above, any native oxide on the exposed surface of the contact 1004 may be removed by sputtering using one or more gaseous species, such as argon or other noble gas. In some instances, the sputtering may be performed in-situ or without the need to break vacuum (i.e. performed in the same process chamber or a different process chamber of the same process tool). After the native oxide is removed, a contact liner 2002 is formed on the side and bottom surfaces of the recesses 1400. The contact liner 2002 may be similar in composition to the contact liner 902. In that regard, the contact liner 2002 may include metals (e.g., Ti, Ta, Co, W, Al, Ni, Cu, Co, etc.), metal nitrides, metal silicon nitrides, and/or other suitable materials. In various embodiments, the contact liner 2002 includes Ti and/or TiN. A contact fill 2004 is formed on the contact liner 2002 in the recesses 1400 to define contact 2006 that includes the contact liner 2002 and the contact fill 2004. The contact fill 2004 may be similar in composition to the contact fill 1002. In that regard, the contact fill 2004 may include metals (e.g., W, Co, Al, Ta, Ti, Ni, Cu, etc.), metal oxides, metal nitrides and/or combinations thereof, and in an example, the contact fill 2004 includes ruthenium. A Chemical Mechanical Planarization/Polishing (CMP) process may be performed following the deposition of the contact fill 2004 to planarize the third ILD layer 1300, the contact liner 2002, and the contact fill 2004.

While the method 100 is described and illustrated as a process with respect to a contact that is electrically coupled to the source/drain feature 210, the method 100 of the present disclosure may equally apply to a contact electrically coupled to a gate structure, such as the gate structure 214.

The embodiments, including the alternative embodiments, of the present disclosure provide several benefits. The use of the room temperature ionic liquid to recess the contact reduces or even eliminates production of oxide during the contact recess/pullback. As some of the metal oxide generated during the contact recess, such as ruthenium (VIII) oxide ($RuO_4$), may be volatile (i.e. having a low boiling point) and toxic, the use of the room temperature ionic liquid may prevent toxic gas formation, which may require additional equipment for safe disposal. The solid form of oxide, such as ruthenium (IV) oxide ($RuO_2$), may become a particle source and lower yield. By reducing or eliminating the production of oxide, the method of present disclosure may reduce particle contamination and increase yield.

Thus, the present disclosure provides examples of an integrated circuit with an interconnect structure and a method for forming the integrated circuit. In one embodiment, a method of forming a low resistance contact in an integrated circuit device is provided. The method includes receiving a workpiece that includes a first recess in a dielectric layer over the workpiece; depositing a contact fill in the first recess and over the dielectric layer to form a contact feature; planarizing a top surface of the workpiece to remove the contact fill over the dielectric layer; depositing an interlayer dielectric layer over the planarized top surface of the workpiece; forming a second recess in the interlayer dielectric layer to expose the contact fill in the dielectric layer; recessing the contact fill by soaking the workpiece in a room temperature ionic liquid, wherein material forming the contact fill is soluble in the room temperature ionic liquid; and depositing a conductive layer over the recessed contact fill.

In some embodiments, the depositing of the contact fill in the method is performed using atomic layer deposition (ALD). In some implementations, the contact fill includes Ru, Pt, Au, Co, W, Al, Ta, TaN, Ti, Ni, NiPt, Cu, or a combination thereof. In some instances, the room temperature ionic liquid includes imidazolium, pyridinium, pyrrolidinium, phosphonium, ammonium, sulfonium, or a combination thereof. In some embodiments, the room temperature ionic liquid includes alkylsulfate, tosylate, methanesulfonate, bis(trifluoromethyl-sulfony)imide, hexafluoro phosphate, tetrafluoro borate, halide, or a combination thereof. In some implementations, the recessing of the contact fill of the method does not form any oxide of the material forming the contact fill.

In another embodiment, a method of recessing a contact on an integrated circuit device is provided. The method includes receiving a workpiece that includes a contact exposed in a bottom surface of a recess in an interlayer dielectric layer over a workpiece; and recessing the contact using an etchant solution comprising a room temperature ionic liquid, wherein material forming the contact is soluble in the room temperature ionic liquid.

In some embodiments, the room temperature ionic liquid includes a cation selected from a group consisting of imidazolium, pyridinium, pyrrolidinium, phosphonium, ammonium, sulfonium; and an anion selected from a group consisting of alkylsulfate, tosylate, methanesulfonate, bis (trifluoromethyl-sulfony) imide, hexafluoro phosphate, tetrafluoro borate, halide. In some implementations, the etchant solution further includes a ligand coordinatable with an ionic form of the material forming the contact. In some instances, the material includes Ru, Pt, Au, Co, W, Al, Ta, TaN, Ti, Ni, NiPt, Cu, or a combination thereof. In some embodiments, the method of the present disclosure further includes oxidizing a top surface of the contact with an oxidizer; and after oxidizing the top surface of the contact with the oxidizer and before recessing the contact using the etchant solution, rinsing the top surface of the contact with the room temperature ionic liquid to remove residues of the oxidizer. In some embodiments, the method further includes applying an electrical potential to cause anodic oxidation of the material forming the contact. In some implementations, the electrical potential is between about 0.1 volt and about 3 volts. In some instances, the electrical potential is below a decomposition voltage of the room temperature ionic liquid in the etchant solution.

In yet another embodiment, a method of forming a low resistance contact in an integrated circuit device is provided. The method includes receiving a workpiece that includes a contact exposed in a bottom surface of a recess in an interlayer dielectric layer over the workpiece, wherein the contact is electrically coupled to a gate structure or a source/drain feature of the integrated circuit device; recessing a contact fill of the contact by soaking the workpiece in a room temperature ionic liquid, wherein the contact fill is soluble in the room temperature ionic liquid; and depositing a conductive layer over the recessed contact fill of the contact.

In some embodiments, the contact fill of the contact includes Ru, Pt, Au, Co, W, Al, Ta, TaN, Ti, Ni, NiPt, Cu, or a combination thereof. In some implementations, the recessing of the contact fill of the contact does not form any oxide of the contact fill. In some instances, the room temperature ionic liquid includes a cation selected from a group consisting of imidazolium, pyridinium, pyrrolidinium, phosphonium, ammonium, sulfonium; and an anion selected from a group consisting of alkylsulfate, tosylate, methanesulfonate, bis(trifluoromethyl-sulfony) imide, hexafluoro phosphate, tetrafluoro borate, halide. In some embodiments, the room temperature ionic liquid further includes a ligand coordinatable with an ionic form of material forming the contact fill. In some instances, the ligand includes bipyridine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a low resistance contact in an integrated circuit device, the method comprising:
   receiving a workpiece that includes a first recess in a dielectric layer over the workpiece;
   depositing a contact fill in the first recess and over the dielectric layer to form a contact feature;
   planarizing a top surface of the workpiece to remove the contact fill over the dielectric layer;
   depositing an interlayer dielectric layer over the planarized top surface of the workpiece;
   forming a second recess in the interlayer dielectric layer to expose the contact fill in the dielectric layer;
   recessing the contact fill using a room temperature ionic liquid and an oxidizer; and
   depositing a conductive layer over the recessed contact fill.

2. The method of claim 1, wherein the depositing of the contact fill is performed using atomic layer deposition (ALD).

3. The method of claim 1, wherein the contact fill comprises Ru, Pt, Au, Co, W, Al, Ta, TaN, Ti, Ni, NiPt, Cu, or a combination thereof.

4. The method of claim 1, wherein the room temperature ionic liquid comprises imidazolium, pyridinium, pyrrolidinium, phosphonium, ammonium, sulfonium, or a combination thereof.

5. The method of claim 1, wherein the room temperature ionic liquid comprises alkylsulfate, tosylate, methanesulfonate, bis(trifluoromethyl-sulfony) imide, hexafluoro phosphate, tetrafluoro borate, halide, or a combination thereof.

6. The method of claim 1,
   wherein the contact fill comprises ruthenium,
   wherein the recessing of the contact fill does not form ruthenium (VIII) oxide ($RuO_4$).

7. A method of recessing a contact on an integrated circuit device, the method comprising:
   receiving a workpiece that includes a contact exposed in a bottom surface of a recess in an interlayer dielectric layer over the workpiece; and
   recessing the contact using a room temperature ionic liquid and an oxidizer, wherein the recessing comprises:
      oxidizing a top surface of the contact with the oxidizer, and
      after oxidizing the top surface of the contact with the oxidizer, rinsing the top surface of the contact with the room temperature ionic liquid to remove residues of the oxidizer.

8. The method of claim 7, wherein the room temperature ionic liquid comprises:
   a cation selected from a group consisting of imidazolium, pyridinium, pyrrolidinium, phosphonium, ammonium, sulfonium; and
   an anion selected from a group consisting of alkylsulfate, tosylate, methanesulfonate, bis(trifluoromethyl-sulfony) imide, hexafluoro phosphate, tetrafluoro borate, halide.

9. The method of claim 7, wherein the recessing further comprises use of a ligand coordinatable with an ionic form of a material forming the contact.

10. The method of claim 9, wherein the material comprises Ru, Pt, Au, Co, W, Al, Ta, TaN, Ti, Ni, NiPt, Cu, or a combination thereof.

11. A method of forming a low resistance contact in an integrated circuit device, the method comprising:
   receiving a workpiece that includes a contact exposed in a bottom surface of a recess in an interlayer dielectric layer over the workpiece, wherein the contact is electrically coupled to a gate structure or a source/drain feature of the integrated circuit device;
   recessing a contact fill of the contact by soaking the workpiece in a room temperature ionic liquid, wherein the contact fill is soluble in the room temperature ionic liquid; and
   depositing a conductive layer over the recessed contact fill of the contact.

12. The method of claim 11, wherein the contact fill of the contact comprises Ru, Pt, Au, Co, W, Al, Ta, TaN, Ti, Ni, NiPt, Cu, or a combination thereof.

13. The method of claim 11,
   wherein the contact fill of the contact comprises ruthenium,
   wherein the recessing of the contact fill of the contact does not form ruthenium (VIII) oxide ($RuO_4$).

14. The method of claim 11, wherein the room temperature ionic liquid comprises:

a cation selected from a group consisting of imidazolium, pyridinium, pyrrolidinium, phosphonium, ammonium, sulfonium; and an anion selected from a group consisting of alkylsulfate, tosylate, methanesulfonate, bis(trifluoromethylsulfony) imide, hexafluoro phosphate, tetrafluoro borate, halide.

15. The method of claim 11, wherein the room temperature ionic liquid further comprises a ligand coordinatable with an ionic form of material forming the contact fill.

16. The method of claim 15, wherein the ligand comprises bipyridine or benzotriazole.

17. The method of claim 7, wherein the recessing is performed at a temperature between about 5° C. and about 100° C.

18. The method of claim 7,
wherein the contact comprises ruthenium,
wherein the recessing of the contact does not form ruthenium (VIII) oxide ($RuO_4$).

19. The method of claim 7, wherein the oxidizer comprises ceric ammonium nitrate (CeAN or CAN), hydrogen peroxide, periodic acid, fluorine, bromine, chlorine, iodine, $Fe(C_5H_5)_2$ (ferrocene), benzoquinone (1,4-benzoquinone), catechol (1,2-benzoquinone), or 1,4-napthoquinone.

20. The method of claim 1, wherein the room temperature ionic liquid comprises 1-butyl-3 methyl imidazolium (BMI) as a cation and hexafluorophosphate ($PF_6$) as an anion.

* * * * *